(12) United States Patent
Kishida et al.

(10) Patent No.: US 11,835,598 B2
(45) Date of Patent: Dec. 5, 2023

(54) MAGNETIC FIELD MEASUREMENT CABLE AND DISTRIBUTED-TYPE WELL INSIDE MAGNETIC FIELD MEASUREMENT SYSTEM

(71) Applicant: PETROLIAM NASIONAL BERHAD (PETRONAS), Kuala Lumpur (MY)

(72) Inventors: Kinzo Kishida, Kobe (JP); Ahmad Riza Ghazali, Kajang (MY); Mohamad Faizal bin Abd Rahim, Kajang (MY)

(73) Assignee: PETROLIAM NASIONAL BERHAD, Kuala Lumpur (MY)

( * ) Notice: Subject to any disclaimer, the term of this patent is extended or adjusted under 35 U.S.C. 154(b) by 0 days.

(21) Appl. No.: 17/637,035

(22) PCT Filed: Aug. 21, 2020

(86) PCT No.: PCT/MY2020/050071
§ 371 (c)(1),
(2) Date: Feb. 21, 2022

(87) PCT Pub. No.: WO2021/034186
PCT Pub. Date: Feb. 25, 2021

(65) Prior Publication Data
US 2022/0283248 A1    Sep. 8, 2022

(30) Foreign Application Priority Data
Aug. 22, 2019    (MY) .......................... PI 2019004848

(51) Int. Cl.
*G01R 33/032*    (2006.01)
*G01R 33/025*    (2006.01)

(52) U.S. Cl.
CPC ....... *G01R 33/0322* (2013.01); *G01R 33/025* (2013.01)

(58) Field of Classification Search
CPC ............. G01R 33/0322; G01R 33/025; G01R 33/032; Y02A 90/30; H01B 7/226; H01B 9/005
(Continued)

(56) References Cited

U.S. PATENT DOCUMENTS 8,111,584 B1 * 2/2012 Langston ............. G01R 33/032
367/128
2006/0126990 A1 * 6/2006 Deng ................... G01R 33/032
385/12

(Continued)

FOREIGN PATENT DOCUMENTS

CN    103280273 A  *  9/2013
CN    204315285 U  *  5/2015

OTHER PUBLICATIONS

International Search Report and Written Opinion of the International Searching Authority issued in PCT/MY2020/050071, dated Dec. 7, 2020; ISA/KR.

*Primary Examiner* — Christopher P McAndrew
(74) *Attorney, Agent, or Firm* — Harness, Dickey & Pierce, P.L.C.

(57) ABSTRACT

A magnetic field measurement cable (10) of the present disclosure includes an electric cable (1) provided at an axial part, and an outer circumferential cable (2) provided on the outer side of the electric cable (1) and helically formed by a plurality of steel wires helically wound and a magnetic field measurement optical cable (3) having an optical fiber cable (3a).

4 Claims, 6 Drawing Sheets

(58) Field of Classification Search
USPC ...................................................... 324/244.1
See application file for complete search history.

(56) References Cited

U.S. PATENT DOCUMENTS

| | | | |
|---|---|---|---|
| 2012/0045165 A1* | 2/2012 | Carralero | G01L 1/24 385/13 |
| 2013/0154632 A1* | 6/2013 | McEwen-King | G01R 33/0327 385/100 |
| 2016/0274262 A1* | 9/2016 | Mandviwala | G01R 33/0327 |
| 2017/0292862 A1* | 10/2017 | Godfrey | G02B 6/4415 |
| 2018/0180658 A1* | 6/2018 | Godfrey | G02B 6/4416 |
| 2019/0056278 A1* | 2/2019 | Risch | H01B 7/32 |

* cited by examiner

TABLE 1. SPECIFICATION EXAMPLE OF USED ELECTRIC CABLE

- CABLE SPECIFICATIONS: AWG 16
    AWG 16 SPECIFICATIONS:
        - OUTER DIAMETER      : 1.291 mm
        - SECTIONAL AREA      : 1.309 mm$^2$
        - ELECTRIC RESISTANCE : 12.5 (mΩ/m, Cu)
        - ALLOWABLE CURRENT   : 18 A (90°C)
        - FUSING CURRENT      : 398 A (1s)

- TEMPERATURE SPECIFICATION: 200°C

- INSULATION VOLTAGE: 5000 V

- CABLE OUTER DIAMETER: 2.4 mm

MAGNETIC FIELD MEASUREMENT CABLE AND DISTRIBUTED-TYPE WELL INSIDE MAGNETIC FIELD MEASUREMENT SYSTEM

CROSS REFERENCE TO RELATED APPLICATIONS

This application is a U.S. National Phase Application under 35 U.S.C. 371 of International Application No. PCT/MY2020/050071 filed on Aug. 21, 2020, which claims the benefit of priority from Malaysian Patent Application No. PI 2019004848 filed on Aug. 22, 2019. The entire disclosures of both above applications are incorporated herein by reference.

TECHNICAL FIELD

The present disclosure relates to a magnetic field measurement cable and a distributed-type well inside magnetic field measurement system.

BACKGROUND ART

Electric measurement logging as an electric measurement method for an oil well is basic technology for oil well measurement. Plenty of historical material about the electric measurement logging has been collected, and the electric measurement logging has played an important role in oilfield development. Recently, instead of the electric measurement logging, methods using optical fibers are gradually spreading (see, for example, Patent Documents 1 and 2).

However, it is generally recognized that optical fibers are not influenced by electromagnetic properties, and technology thereof similar to electric measurement logging has not been practically used at present.

However, recently, distribution measurement technology focusing on polarization of Rayleigh scattering has been realized (see, for example, Non-Patent Document 1). In this technology, focusing on a birefringence vector $\beta$ generated in an optical fiber, Expression (1) is proposed.

[Mathematical 1]

$$\overline{\beta} \equiv \begin{pmatrix} \beta_1(j) \\ \beta_2(j) \\ \beta_3(j) \end{pmatrix} = \begin{pmatrix} \beta_1 \\ \beta_2 \\ 0 \end{pmatrix} + \begin{pmatrix} 0 \\ 0 \\ \beta_3(j) \end{pmatrix} \quad (1)$$

Here, j is a variable indicating the axial direction of the optical fiber, the first term on the right-hand side represents linear birefringence, and the second term on the right-hand side represents circulative birefringence.

The linear birefringence occurs due to the shape or deformation of a measurement target, and the circulative birefringence occurs due to torsion of the measurement target or Faraday effect based on a magnetic field.

In the above Expression (1), $\beta_3$ is represented by Expression (2) shown below (see Non-Patent Document 2).

[Mathematical 2]

$$\beta_3 = \beta_c + \eta = -g\tau + 2\nu B \cos \varphi \quad (2)$$

Here, g is a photoelasticity coefficient (g≈0.15), $\tau$ is a torsion angle, $\nu$ is a Verdet coefficient, B is a magnetic field intensity, and $\varphi$ is the rotation angle of light (see, for example, Non-Patent Document 3).

It is noted that $\nu$ is represented as $\nu=1.43/\lambda^2$ (unit of $\lambda$ is μm), and normally (in case of $\lambda=1.5$ μm), is 0.6 rad/T/m.

Regarding the Faraday effect based on a magnetic field, a POFDR (abbreviation of Polarimetric Optical Frequency Domain Reflectometer, which has a standard OFDR equipped with a polarization controller) method for realizing distribution measurement for current is known.

Regarding this, Palmieri, et al. have examined the Faraday effect (change in rotation angle) based on change in a magnetic field, while changing the intensity of current up to 2.5 kA with a resolution of 100 A, using experimental equipment for current measurement, and have clarified through measurements that the rotation angle is changed when the measurement position is changed.

Here, in the experimental equipment used by Palmieri et al., two current circuits each having a length of 20 m are arranged in parallel so as to be separated from each other by 1.2 m, and using the current circuits, connection is made such that current having a magnitude of I flows from a central conductor 1 so as to be branched half and half as currents having magnitudes of I/2 into two conductors (one of which is a conductor 3 to be subjected to this measurement) located on the outer side of the central conductor 1. In addition, a measurement cable having a sensing function is helically wound with a pitch p around the outer circumference of each of the conductor 1 and the conductor 3. In this experimental equipment, the above POFDR method is applied, whereby change in the rotation angle with respect to change in the measurement position, i.e., the Faraday effect based on change in a magnetic field is measured (see Non-Patent Document 3).

CITATION LIST

Patent Document

Patent Document 1: Japanese Laid-Open Patent Publication No. 2011-27533
Patent Document 2: Japanese Translation of PCT International Application Publication No. 2005-517105

Non-Patent Document

Non-Patent Document 1: Luca Palmieri, "Distributed polarimetric measurements for optical fiber sensing", Optical Fiber Technology 19, December 2013, pp. 720-728.
Non-Patent Document 2: Andrea Galtarossa et al., "Distributed polarization sensing", Proc. SPIE 10323, 25th International Conference on Optical Fiber Sensors, 1032318, 23 Apr. 2017.
Non-Patent Document 3: Zhenyang Ding, et al., "Distributed Optical Fiber Sensors Based on Optical Frequency Domain Reflectometry: A review", Sensors 2018, 18, 1072; doi10.3390/s18041072.

SUMMARY OF THE INVENTION

Problems to be Solved by the Invention

The above Verdet coefficient determines the polarization sensitivity of the optical fiber, and the magnitude thereof has not been greatly improved. Specifically, accuracy actually required is $10^{-4}$ A, whereas in the study in the above document, current measurement accuracy of only 0.1 KA has been achieved.

In addition, as described above, the birefringence vector $\beta$ depends on "torsion", and therefore the influence thereof cannot be neglected. Considering the usage conditions in an actual well that, for example, an optical fiber having a long size (e.g., 3 km or longer) is needed and the usage environment is severe, it is difficult to ensure the condition that there is no torsion.

The present disclosure has been made to solve the above problem, and an object of the present disclosure is to provide a magnetic field measurement cable using an optical fiber, and a distributed-type well inside magnetic field measurement system, in which a problem of accuracy in Verdet coefficient and a problem of torsion have been solved.

Solution to the Problems

A magnetic field measurement cable according to the present disclosure is a magnetic field measurement cable including an optical fiber for measuring a magnetic field at a desired location, the magnetic field measurement cable including: an electric cable provided at an axial part of the magnetic field measurement cable; and an outer circumferential cable including a plurality of cables and an optical cable composed of the optical fiber and a plurality of steel wires helically wound so as to surround the optical fiber, the plurality of cables and the optical cable being helically wound so as to surround an outer circumference of the electric cable, the magnetic field measurement cable being configured to detect frequency shift of scattering light of the optical fiber placed at the desired location.

A distributed-type well inside magnetic field measurement system according to the present disclosure is a distributed-type well inside magnetic field measurement system including: the above magnetic field measurement cable; and a calculation device which performs calculation on a signal and performs storage, wherein, on the basis of a relationship between a magnetic field and frequency shift of scattering light of an optical fiber calculated through measurement in advance, the calculation device performs calculation on a signal of the frequency shift detected by the magnetic field measurement cable, and calculates a distribution of a magnetic field in association with a placed position of the optical cable placed at a measurement position inside a well which is a measurement target.

Effect of the Invention

The magnetic field measurement cable and the distributed-type well inside magnetic field measurement system according to the present disclosure can obtain a significant effect that it becomes possible to provide a magnetic field measurement cable using an optical fiber, and a distributed-type well inside magnetic field measurement system, in which a problem of accuracy in Verdet coefficient and a problem of torsion have been solved.

DESCRIPTION OF EMBODIMENTS

Embodiment 1

First, physical properties of an optical fiber used for achieving an object of the present disclosure, in particular, a relationship thereof with a magnetic field, will be described below.

Conventionally, it has been considered that a communication optical fiber normally does not exhibit a magnetic field reaction as described above. However, through a test using an optical fiber located at the axis position of a column of a columnar electromagnet, it has been found that the optical fiber exhibits a magnetic field reaction. This will be more specifically described below, with reference to the drawings.

Figure 1:
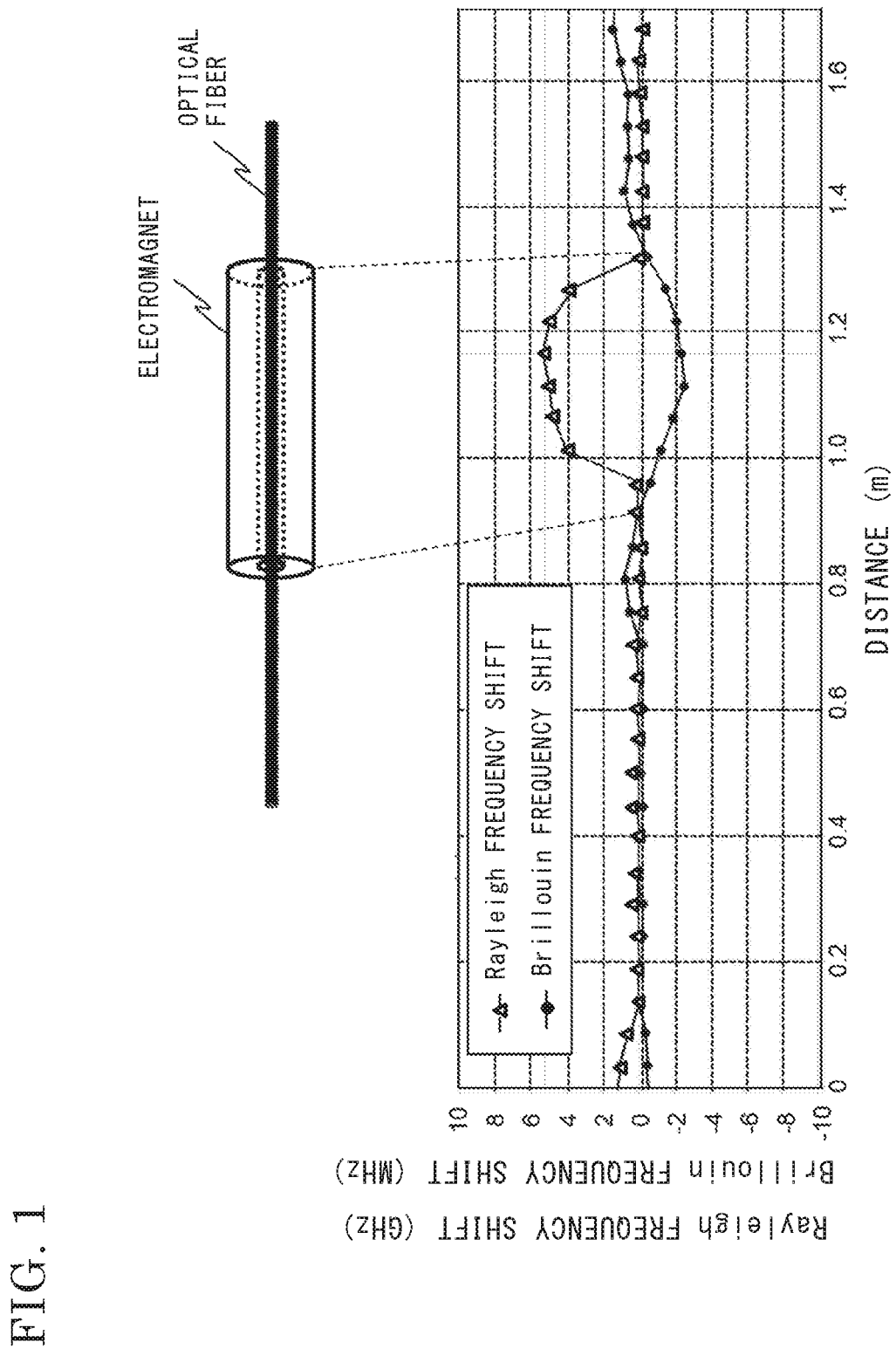
FIG. 1 shows an example of a physical property of an optical fiber for illustrating the principle of a distributed-type well inside magnetic field measurement system according to embodiment 1.

FIG. 1 shows an example of a spatial distribution of frequency shifts of Rayleigh scattering light and Brillouin scattering light which are backscatter light of an optical fiber in a magnetic field. In FIG. 1, the horizontal axis indicates the distance (unit: m), and the vertical axis indicates frequency shift (unit: MHz) of Brillouin scattering light and frequency shift (unit: GHz) of Rayleigh scattering light. An electromagnet was disposed at a position corresponding to the coordinate range from 59.9 m to 60.3 m in the distance of the optical fiber, and the value of current flowing through the electromagnet was changed to change the intensity of a magnetic field generated by the electromagnet. In this case, for both Brillouin scattering light and Rayleigh scattering light, frequency shift appeared correspondingly at the position where the electromagnet was disposed, as shown in the graph in FIG. 1. From this fact, conversely, it can be expected that it is possible to measure change in the magnetic field by using Brillouin scattering light and Rayleigh scattering light.

Accordingly, next, in order to investigate a quantitative relationship between the change in the magnetic field intensity and the frequency shift, the relationship between temporal change in the magnetic field intensity (which here means change in the magnetic flux density) and frequency shift (of Rayleigh scattering light) was measured quantitatively, using Rayleigh scattering light. A result thereof is shown in FIG. 2.

Figure 2:
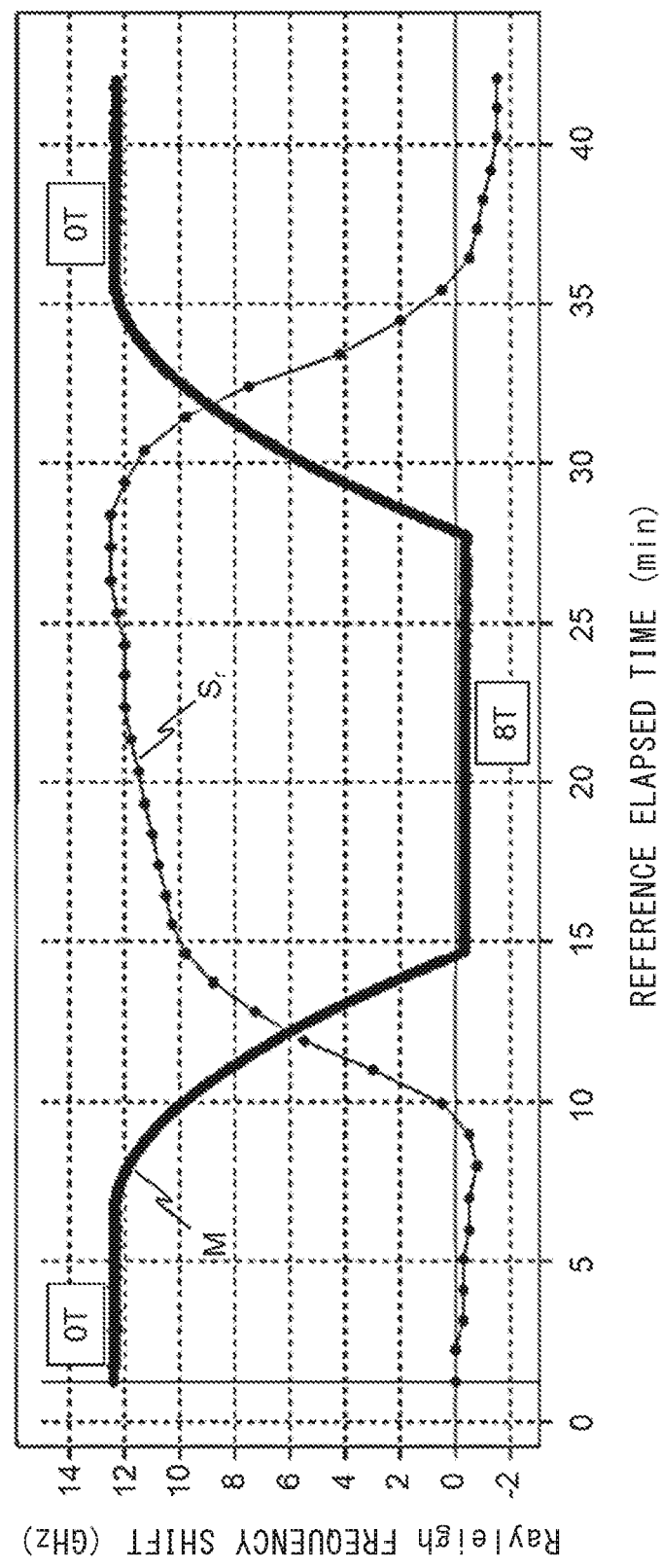
FIG. 2 shows the relationship between magnetic field change and scattering light change over time, for illustrating the principle of the distributed-type well inside magnetic field measurement system according to embodiment 1.

In FIG. 2, the horizontal axis indicates time after start of the measurement, by the minute. On the other hand, the vertical axis indicates frequency shift of Rayleigh scattering light, by GHz. In the graph, a curve connecting dots represents change in frequency shift of Rayleigh scattering light. On the other hand, a curve of a thick solid line represents temporal change in the magnetic flux density. As shown in FIG. 2, the magnetic flux density was increased from 0 to 8 T (tesla) in a measurement period of 30 minutes, and then was changed to 0 again.

As shown in FIG. 2, it is found that, as the value of a magnetic field (magnetic flux density) M increases from 0 to 8 T (tesla), frequency shift of Rayleigh scattering light changes from 0 to about 10 GHz. In addition, during a period in which the value of the magnetic flux density is 8 T (period approximately from 15 minutes to 28 minutes after start of measurement), the frequency shift (amount) of Rayleigh scattering light exhibits approximately 10 GHz to 12 GHz which can be considered to be almost constant, though there is slight change.

From the above result, it can be said that the frequency shift (amount) of Rayleigh scattering light changes along with change in the magnetic flux density. That is, it has become clear that it is possible to measure the magnetic field intensity by using scattering light of the optical fiber. It is noted that the strain change amount of the optical fiber with respect to frequency shift of Rayleigh scattering light per 1 GHz is 25 to 30µε.

Figure 3:
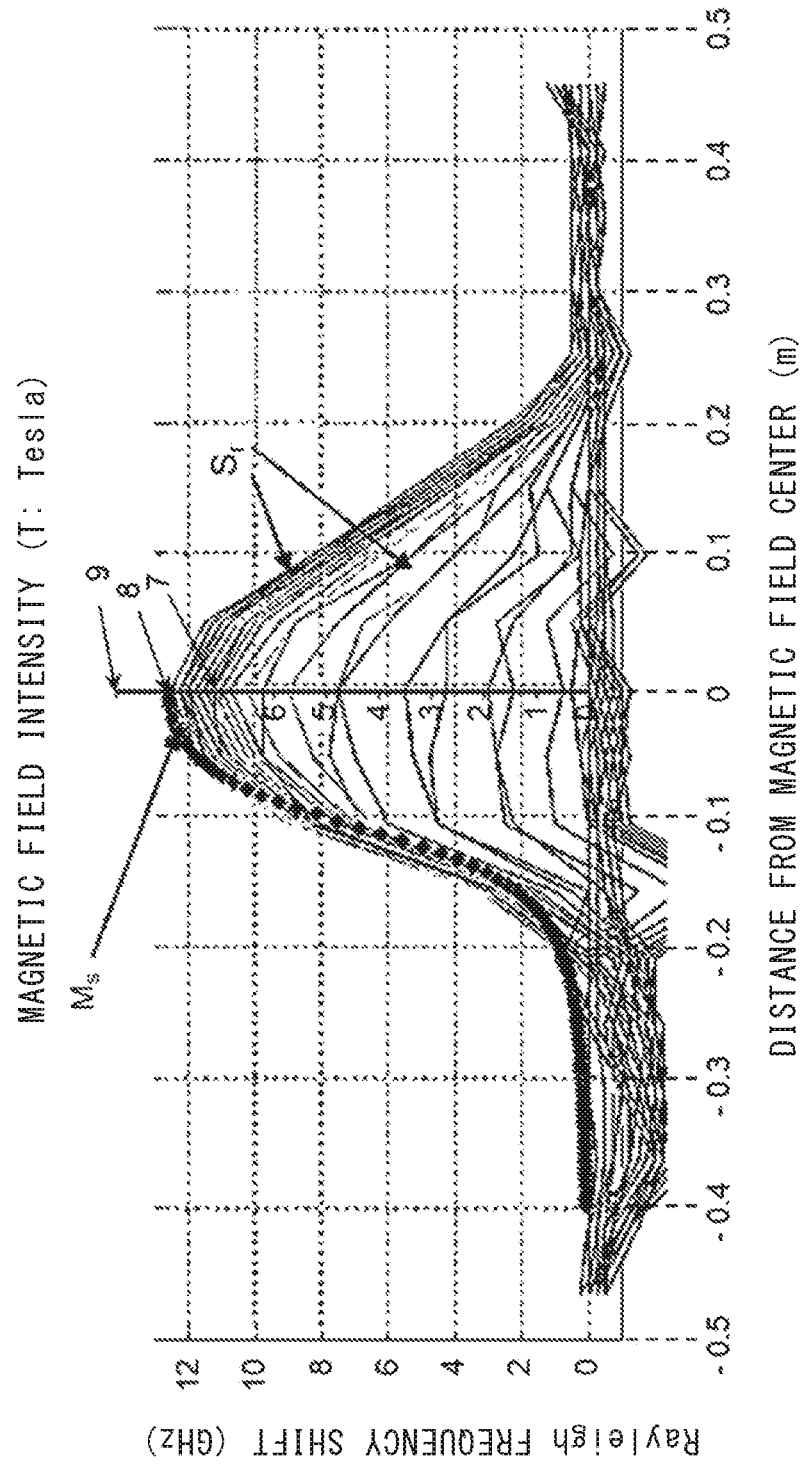
FIG. 3 is a graph illustrating the relationship of temporal change and spatial change in scattering light and a magnetic field, according to embodiment 1.

FIG. 3 shows the magnetic field intensity, and temporal change and spatial change in frequency shift of Rayleigh scattering light with respect thereto, at the same time. In the graph, the horizontal axis indicates the distance (unit: m) from the magnetic field center (position), with the magnetic field center position defined as 0. The vertical axis at the magnetic field center position (center axis position) indicates the magnetic field intensity with a scale of one-tesla basis from 1 to 9 T (tesla). In addition, the vertical axis at the left of the graph indicates frequency shift of Rayleigh scattering light with a scale of 2-GHz basis.

In the graph in FIG. 3, quadrangular rhombus marks shown on the left half side with respect to the center axis position of the graph represent spatial change (intensity change due to position change) in the magnetic field intensity (magnetic flux density), and as shown in the graph, the magnetic field intensity changes in a Gaussian distribution shape.

On the other hand, in this case, as for the frequency shift of the Rayleigh scattering light, it is shown that each data represented by a continuously connected curve is changed over time at each corresponding position on the horizontal axis (here, paired data at almost the same values on the center axis correspond to the same value of magnetic field intensity, but in terms of time, respectively correspond to data for the case where the magnetic field intensity is increased and data for the case where the magnetic field intensity is decreased).

As described above, this figure shows the magnetic field intensity, and temporal change and spatial change in frequency shift of Rayleigh scattering light with respect thereto, at the same time, and it can be said that a distribution almost symmetric between right and left with respect to the center axis is obtained for frequency shift of Rayleigh scattering light (it can be said that there is almost no hysteresis between the case of increasing the magnetic field intensity to a certain value and the case of decreasing the magnetic field intensity from the certain value).

Under the above premise, a magnetic field measurement cable 10 that can be used for a distributed-type well inside magnetic field measurement system has been manufactured. Hereinafter, the magnetic field measurement cable 10 will be described in detail with reference to the drawings.

Figure 4:
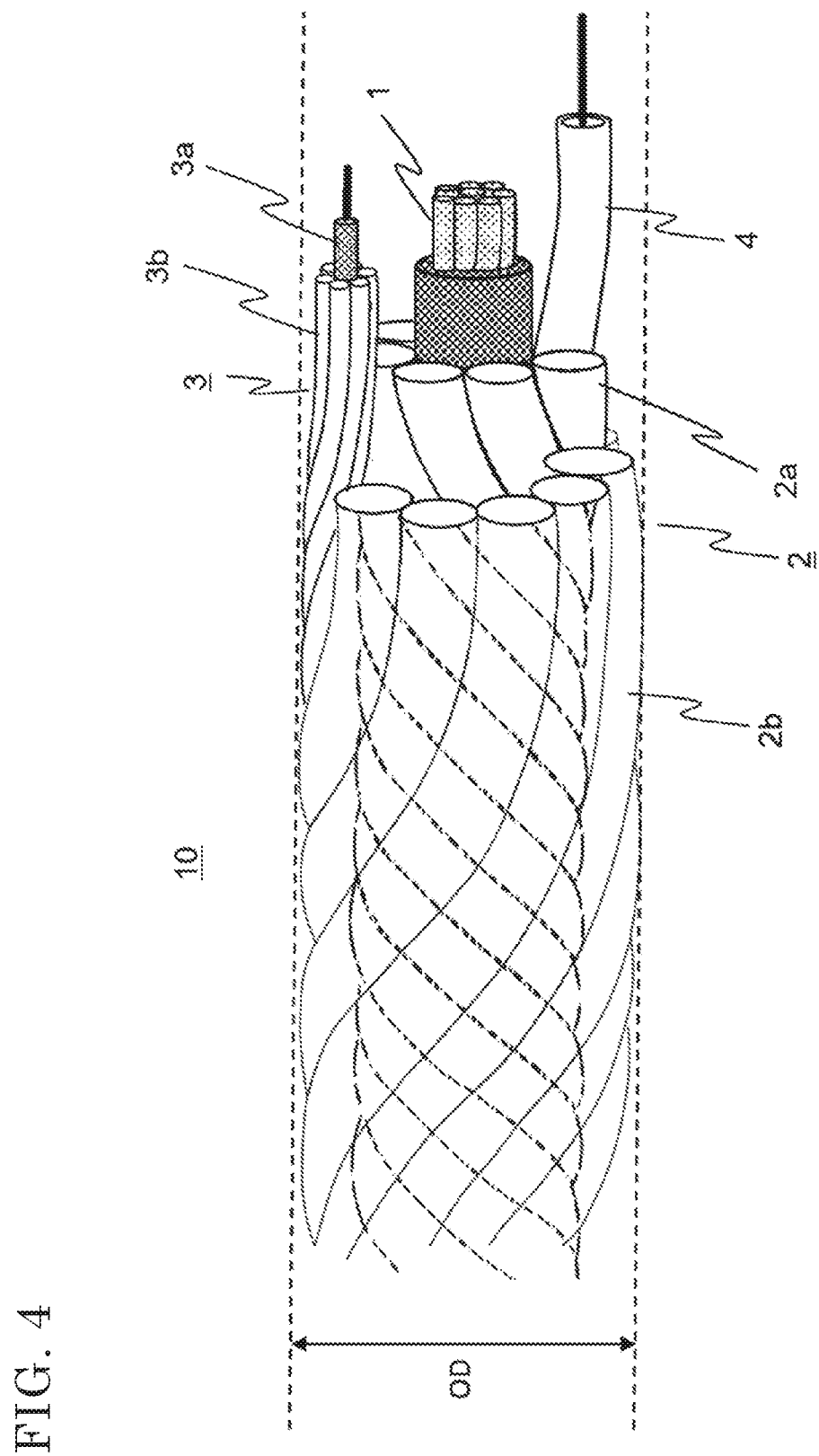
FIG. 4 shows an example of a magnetic field measurement cable used in the distributed-type well inside magnetic field measurement system according to embodiment 1.
Figure 5:
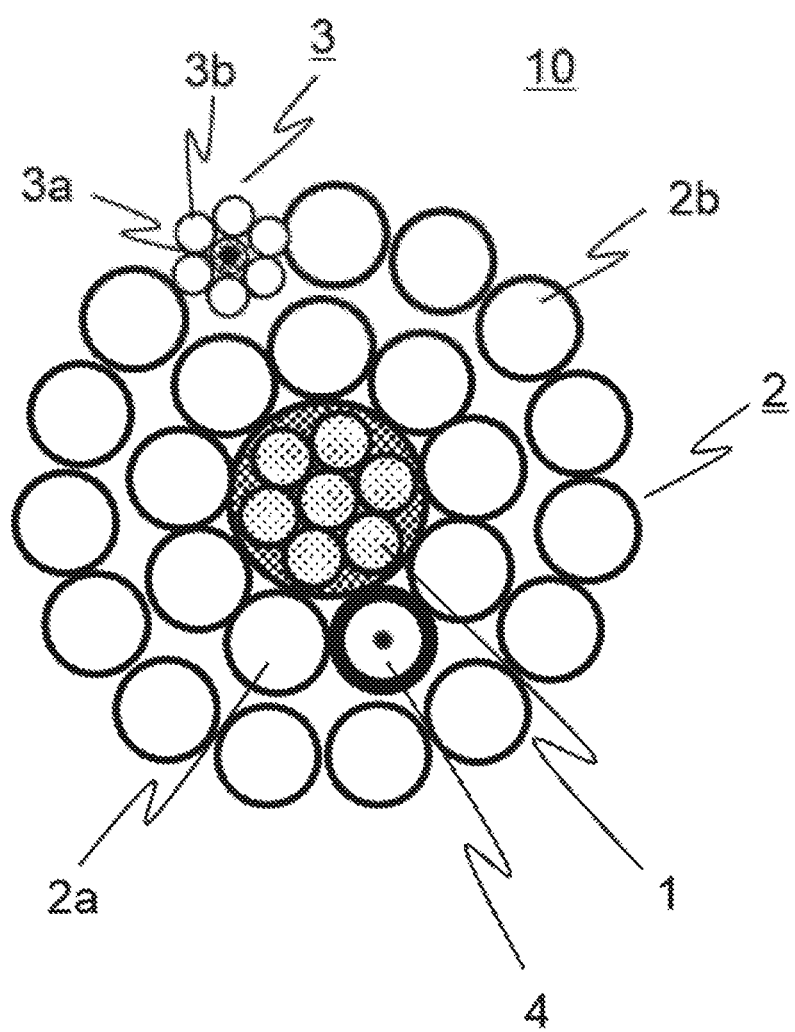
FIG. 5 is a sectional view along a plane perpendicular to the axis of the magnetic field measurement cable shown in FIG. 4.

FIG. 4 and FIG. 5 show an example of the magnetic field measurement cable 10 used for the distributed-type well inside magnetic field measurement system. In FIG. 4 and FIG. 5, at the center axis position in the magnetic field measurement cable 10, an armored-cable-type electric cable 1 which is a conductor cable composed of a plurality of conductive wires in a helically wound FIMT (abbreviation of Fiber in Metal Tube) type, is disposed.

On an immediately outer side of the electric cable 1, an outer circumferential cable 2 formed from two layers is provided which also serves to protect the electric cable 1. Hereinafter, the outer circumferential cable 2 will be described in more detail.

First, in the inner circumferential part of the outer circumferential cable 2, a first outer circumferential cable 2a helically wound and composed of a plurality of steel wires is provided. The plurality of steel wires composing the first outer circumferential cable 2a are partially replaced with a temperature measurement optical fiber built-in cable 4, for example.

On the outer circumference of the first outer circumferential cable 2a (outer circumference around the plurality of steel wires and the temperature measurement optical fiber built-in cable 4), similarly, a second outer circumferential cable 2b helically wound and composed of a plurality of steel wires is provided. In a part of the second outer circumferential cable 2b, a magnetic field measurement optical cable 3 for measuring a distribution of a magnetic field of a measurement target having an electromagnetic property is provided so as to partially replace the steel wires composing the second outer circumferential cable 2b.

Here, the magnetic field measurement optical cable 3 includes an optical fiber cable 3a provided at the center axis position thereof and used for measuring a magnetic field, and an outer circumference protection layer 3b which is provided on the outer circumference of the optical fiber cable 3a in order to protect the optical fiber cable 3a and which is helically wound and composed of a plurality of steel wires.

In the magnetic field measurement cable 10 configured as described above, the magnetic field measurement optical cable 3 is provided at the outer circumferential position, and the optical fiber cable 3a for measuring a magnetic field is used in the magnetic field measurement optical cable 3. Therefore, frequency shift of Rayleigh scattering light described above with reference to FIG. 1 to FIG. 3 can be measured by the magnetic field measurement optical cable 3, and calculation can be performed using a distributed-type well inside magnetic field measurement system 100 including a calculation device 20 which performs calculation on a signal obtained through the measurement and performs storage. Thus, it is possible to measure a distribution of a well inside magnetic field in an oil well to be measured (hereinafter, may be referred to as measurement target) (see FIG. 7).

Here, regarding the magnetic field measurement optical cable 3, there is no risk of torsion of the cable itself in spite of its elongated shape and severe environment as in the inside of an oil well, owing to the outer circumference protection layer 3b helically formed on the outer circumference thereof. The steel wires used as described above are all made of a material that is not magnetically shielded (hereinafter, may be referred to as non-magnetic-shield material). For the steel wires, a non-magnetic-shield material other than a steel wire may be used.

Even in the case where there is an influence of temperature on the magnetic field measurement, since the magnetic field measurement cable 10 has the temperature measurement optical fiber built-in cable 4, it is possible to measure a well inside magnetic field with high accuracy by correcting the influence of temperature (compensating for temperature) at each measurement location in the well, using two signals, i.e., a signal measured by the magnetic field measurement optical cable 3 and a signal measured by the temperature measurement optical fiber built-in cable 4.

Figures 6, 7:
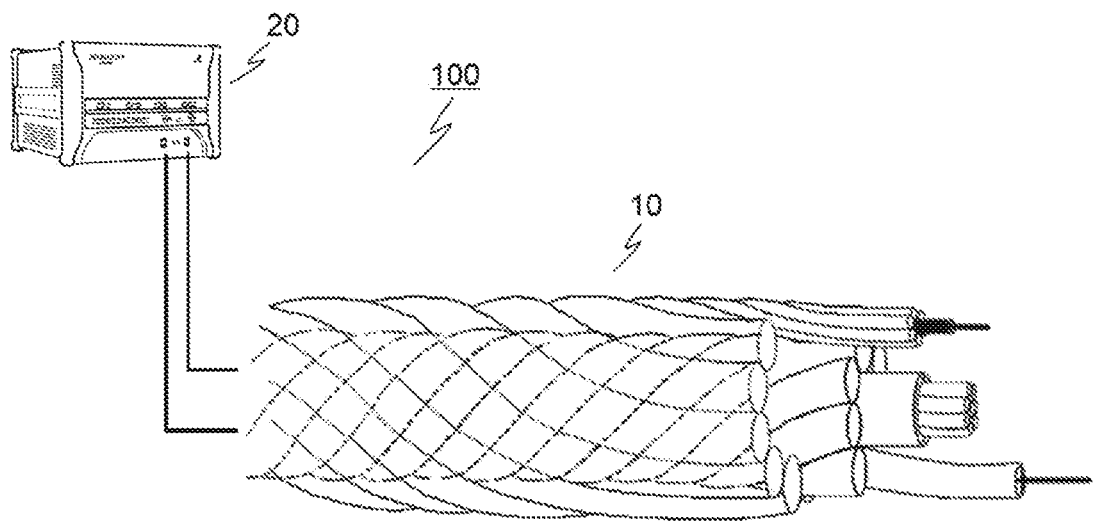
FIG. 6 is a table showing an example of the specifications of an electric cable used in the magnetic field measurement cable shown in FIG. 4.
FIG. 7 shows an example of the distributed-type well inside magnetic field measurement system according to embodiment 1.

Further, the structure of the used magnetic field measurement cable 10 has undergone examination, and the electric cable 1 having multiple cores and made of copper can satisfy specifications shown in a table in FIG. 6. In FIG. 4, OD indicates the outer diameter of the magnetic field measurement cable 10, and specifically, in the case of employing the specifications of American wire gauge (AWG) 16 for the electric cable 1, the outer diameter is 7.3 mm. Here, the AWG is standard specifications that have been mainly used in North America since 1857 and define the diameter, the sectional area, the electric resistance, and the like of a solid and non-iron wire, and the greater the AWG number is, the smaller the outer diameter is. For example, in AWG 16, a diameter dn (unit: mm) of the wire can be obtained by substituting n=16 in Expression (3).

[Mathematical 3]

$$d_n = 0.127 \times 92^{\frac{36-n}{39}} \quad (3)$$

The above standard is also used for a strand wire (for example, corresponding to wires wound helically with each other). In the AWG standard specifications, a total value of the sectional areas of individual strands is indicated (gaps between strands are not included). In the case of a helical strand occupying 25% of the wire area, the outer diameter is greater by about 13% than the equivalent solid wire. This strand wire is characterized by three numerical values, i.e., the AWG entire size, the number of strands, and the AWG size of the strand.

Although the disclosure is described above in terms of an exemplary embodiment, it should be understood that the various features, aspects and functionality described in the embodiment are not limited in their applicability to the particular embodiment with which they are described, but instead can be applied alone or in various combinations to the embodiment of the disclosure.

It is therefore understood that numerous modifications which have not been exemplified can be devised without departing from the scope of the present disclosure. For example, at least one of the constituent components may be modified, added, or eliminated.

DESCRIPTION OF THE REFERENCE CHARACTERS 1 electric cable
2 outer circumferential cable
2a first outer circumferential cable
2b second outer circumferential cable
3 magnetic field measurement optical cable
3a optical fiber cable
3b outer circumference protection layer
4 temperature measurement optical fiber built-in cable
10 magnetic field measurement cable
20 calculation device
100 distributed-type well inside magnetic field measurement system

The invention claimed is:
1. A magnetic field measurement cable comprising:
an electric cable provided at the axial part of the magnetic field measurement cable; and
an outer circumferential cable including;
a plurality of cables; and
an optical cable, wherein the plurality of cables and the optical cable being helically wound so as to surround an outer circumference of the electrical cable, and the optical cable is composed of:
an optical fiber for measuring a magnetic field at a predetermined location; and a plurality of steel wires helically wound around the outer circumference of the optical fiber so as to surround the optical fiber,
and the magnetic field measurement cable is configured to detect frequency shift of scattering light of the optical fiber placed at the predetermined location.

2. The magnetic field measurement cable according to claim 1, wherein
the outer circumferential cable includes:
a first outer circumferential cable provided on an inner circumferential side; and
a second outer circumferential cable provided on an outer circumferential side,
the first outer circumferential cable including a temperature measurement optical fiber built-in cable, and
the optical cable being disposed in the second outer circumferential cable.

3. A distributed in-well magnetic field measurement system comprising:
the magnetic field measurement cable according to claim 1; and
a calculation device which performs calculation on a signal and stores the calculation result, wherein
on the basis of a relationship between a magnetic field and frequency shift of scattering light of the optical fiber calculated through a measurement performed in advance, the calculation device performs calculation on the frequency shift of a signal detected by the magnetic field measurement cable, and calculates a distribution of a magnetic field in association with a position inside a well where the optical cable is laced for the magnetic field measurement.

4. A distributed-type in-well inside magnetic field measurement system comprising:
the magnetic field measurement cable according to claim 2; and
a calculation device which performs calculation on a signal and stores a calculation result wherein
on the basis of a relationship between a magnetic field and frequency shift of scattering light of the optical fiber calculated through a measurement performed in advance, the calculation device performs calculation on the frequency shift of a signal detected by the magnetic field measurement cable and a signal measured by the temperature measurement optical fiber built-in cable, and calculates a distribution of a magnetic field in association with a position inside a well where the optical cable is placed for the magnetic field measurement, in a way such that the distribution of the magnetic field is corrected for an influence of the temperature at the position.

* * * * *